United States Patent
Jang (10) Patent No.: US 7,238,562 B2
(45) Date of Patent: Jul. 3, 2007

(54) METHOD FOR FABRICATING CMOS IMAGE SENSOR

(75) Inventor: James Jang, Cheongju (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/172,150

(22) Filed: Jun. 30, 2005

(65) Prior Publication Data

US 2006/0003519 A1    Jan. 5, 2006

(30) Foreign Application Priority Data

Jul. 1, 2004    (KR) ...................... 10-2004-0051216

(51) Int. Cl.
*H01L 21/8238* (2006.01)
(52) U.S. Cl. ............... 438/199; 438/202; 257/E27.133; 257/233; 257/291; 257/292
(58) Field of Classification Search ................ 438/202, 438/199; 257/59, 72, 222, 233, 234, 292, 257/E27.133, E25.032
See application file for complete search history.

(56) References Cited

U.S. PATENT DOCUMENTS

| 5,841,126 | A |   | 11/1998 | Fossum et al. |
| 5,886,659 | A |   | 3/1999  | Pain et al. |
| 5,990,506 | A |   | 11/1999 | Fossum et al. |
| 6,005,619 | A |   | 12/1999 | Fossum |
| 6,021,172 | A |   | 2/2000  | Fossum et al. |
| 6,023,081 | A | * | 2/2000  | Drowley et al. ............ 257/292 |
| 6,040,593 | A | * | 3/2000  | Park .......................... 257/292 |
| 6,221,686 | B1 | * | 4/2001 | Drowley et al. ............. 438/57 |
| 6,462,365 | B1 |   | 10/2002 | He et al. |
| 6,617,623 | B2 | * | 9/2003 | Rhodes ....................... 257/215 |
| 6,849,886 | B1 |   | 2/2005 | Han |
| 6,900,507 | B1 | * | 5/2005 | Hong .......................... 257/413 |
| 6,908,839 | B2 | * | 6/2005 | Rhodes ....................... 438/595 |

(Continued)

FOREIGN PATENT DOCUMENTS

KR    2003-0097648 A    12/2003

OTHER PUBLICATIONS

Yeong Hun Park et al.; Image sensor and fabricating method thereof; Korean Patent Abstracts; Dec. 31, 2003; Publication No. 1020030097648A; Korean Intellectual Property Office, Republic of Korea, no translate.

*Primary Examiner*—Thao P. Le
(74) *Attorney, Agent, or Firm*—Andrew D. Fortney (57) ABSTRACT

A method for fabricating a CMOS image sensor is disclosed, to decrease a dark current, which includes the steps of forming a photodiode area in a semiconductor substrate; forming a plurality of gates including a first gate on the semiconductor substrate, wherein the first gate has one side aligned to the edge of the photodiode area; sequentially forming a first insulating layer and a second insulating layer on an entire surface of the semiconductor substrate; forming a first photoresist, wherein the firs photoresist is patterned so as to expose the upper side of the first gate and the other side of the gate being opposite to one side of the gate; forming a spacer at the other side of the first gate by dry-etching the second insulating layer in state of using the first photoresist as a mask, and forming a silicide blocking layer above the photodiode area; and removing the first photoresist.

13 Claims, 11 Drawing Sheets

U.S. PATENT DOCUMENTS

| | | | | |
|---|---|---|---|---|
| 6,974,715 B2 * | 12/2005 | Lee | | 438/48 |
| 7,005,689 B2 * | 2/2006 | Song et al. | | 257/290 |
| 7,012,000 B2 * | 3/2006 | Hong | | 438/211 |
| 7,071,505 B2 * | 7/2006 | Rhodes | | 257/292 |
| 2005/0064620 A1 | 3/2005 | Han | | |
| 2005/0064665 A1 | 3/2005 | Han | | |
| 2005/0088556 A1 | 4/2005 | Han | | |
| 2005/0093036 A1 | 5/2005 | Han | | |

* cited by examiner

METHOD FOR FABRICATING CMOS IMAGE SENSOR

CROSS-REFERENCE TO RELATED APPLICATIONS

This application claims the benefit of Korean Application No. P2004-51216 filed on Jul. 1, 2004, which is hereby incorporated by reference as if fully set forth herein.

BACKGROUND OF THE INVENTION

1. Field of the Invention

The present invention relates to an image sensor, and more particularly, to a method for fabricating a CMOS image sensor suitable for decreasing a dark current.

2. Discussion of the Related Art

Generally, a CMOS image sensor is suitable for a SoC (System on Chip). As the CMOS image sensor is scaled down to a deep sub micron below 0.18 µm, the CMOS image sensor has more competitive power than CCD.

With the demands for a technology of the CMOS image sensor below 0.18 µm, the CMOS image sensor has the various problems in fabrication of pixel array, for example, the limit in size of pixel, the non-silicide process, and the uniformity of color filter array.

Among the various problems, the non-silicide (NASL) process is an essential element for a pixel since it has the great effects on a dark current. Also, the technology of the CMOS image sensor is developed to a high-integration design below 0.18 µm. Accordingly, it is very important to control the non-silicide process.

Figure 1:
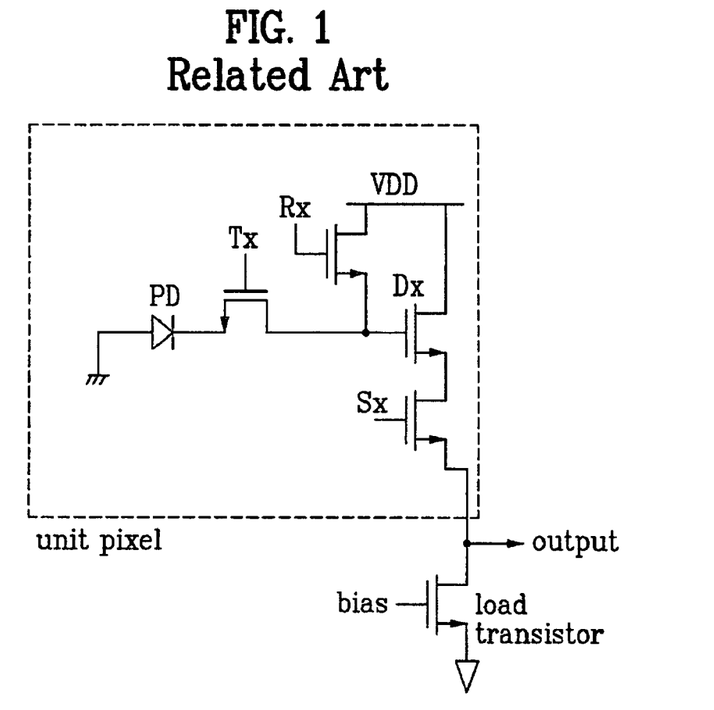
FIG. 1 is a circuit diagram of showing a unit pixel of a 4-T (transistor) CMOS image sensor according to the related art.
Figure 2:
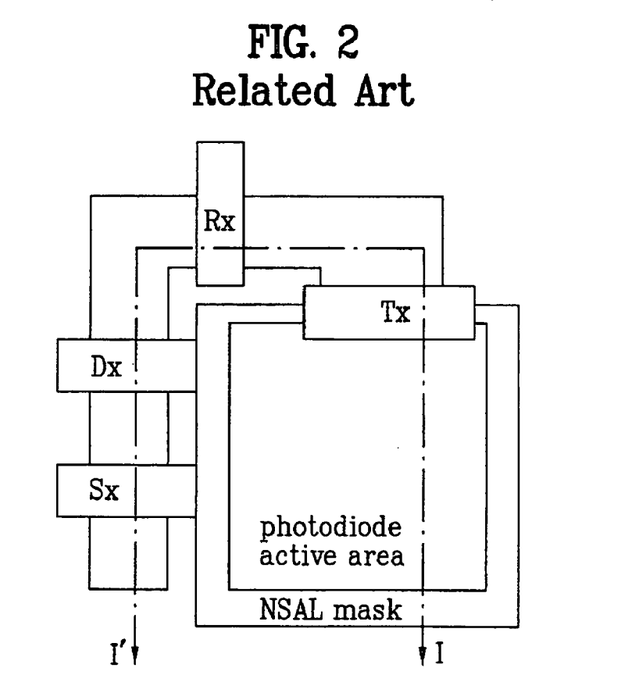
FIG. 2 is a layout of showing a unit pixel of a CMOS image sensor according to the related art.

FIG. 1 is a circuit diagram of showing a unit pixel of a 4-T (transistor) CMOS image sensor according to the related art. FIG. 2 is a layout of showing a unit pixel of a CMOS image sensor according to the related art.

As shown in the drawings, a unit pixel of a 4-T CMOS image sensor is comprised of one photodiode PD and four transistors. The four transistors are formed of a transfer transistor Tx, a reset transistor Rx, a drive transistor Dx and a select transistor Sx. At this time, the transfer transistor Tx transfers optical charges generated in the photodiode PD to a floating diffusion area (FD). The reset transistor Rx sets the electric potential of the floating diffusion area at the predetermined value, and discharges the optical charges to reset the floating diffusion area. Also, the drive transistor Dx functions as a source follow buffer amplifier, and the select transistor Sx is provided for switching and addressing. In addition, a load transistor is provided outside the unit pixel, to read output signals.

In the area of forming the transistors, a silicide layer is formed to improve the speed of the transistors Tx, Rx, Dx and Sx by decreasing a parasitic resistance. However, in case of the photodiode area PD, the silicide layer is not formed due to the optical sensing and dark current leakage. Accordingly, the silicide process is progressed in state of covering the photodiode area with a silicide blocking mask as shown in FIG. 2.

Hereinafter, a method for fabricating a CMOS image sensor according to the related art will be described with reference to the accompanying drawings.

FIG. 3A to FIG. 3F are cross sectional views of showing the process for fabricating a CMOS image sensor according to the related art, which mainly show a photodiode area PD and an adjacent transfer transistor Tx.

Figure 3A:
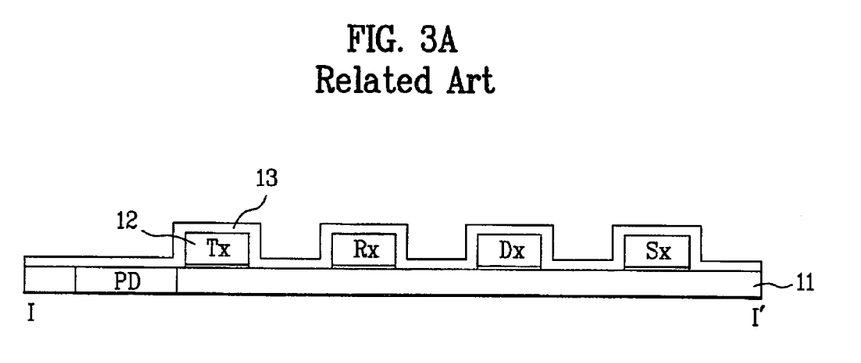

First, as shown in FIG. 3A, a photodiode area PD is formed in a semiconductor substrate 11, and a plurality of gates are formed on the semiconductor substrate 11 by interposing a gate oxide layer. The plurality of gates are formed in a transfer transistor Tx, a reset transistor Rx, a drive transistor Dx and a select transistor Sx. At this time, one side of the gate 12 in the transfer transistor Tx is aligned to the edge of the photodiode area PD.

Figure 3B:
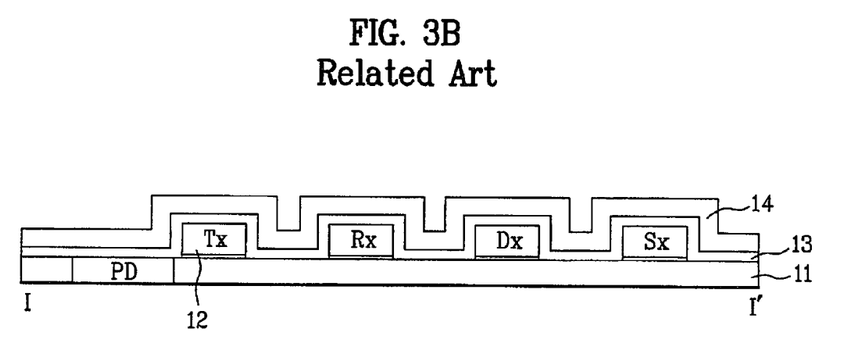
Figure 3C:
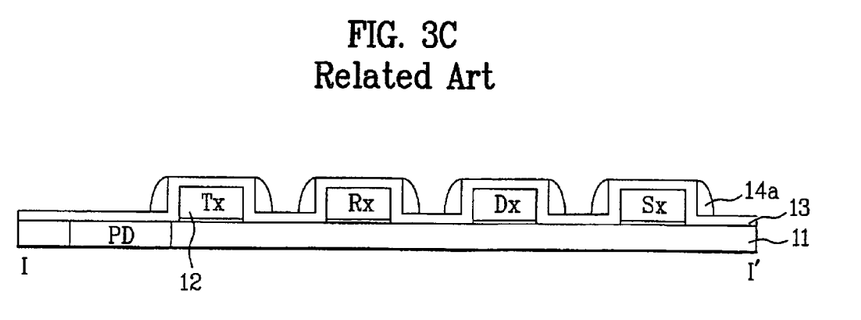

After that, a TEOS layer 13 is formed on an entire surface of the semiconductor substrate 11 including the gate 12. Subsequently, as shown in FIG. 3B, a nitride layer 14 is formed on the TEOS layer 13. Then, as shown in FIG. 3C, a spacer 14a is formed by etching-back the nitride layer 14.

Figure 3D:
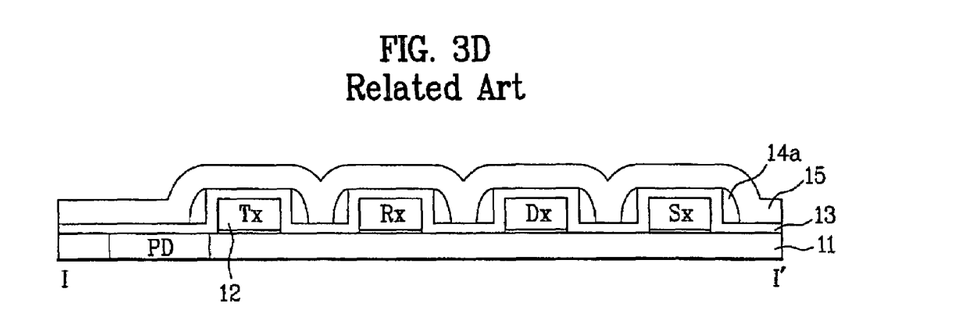
Figure 3E:
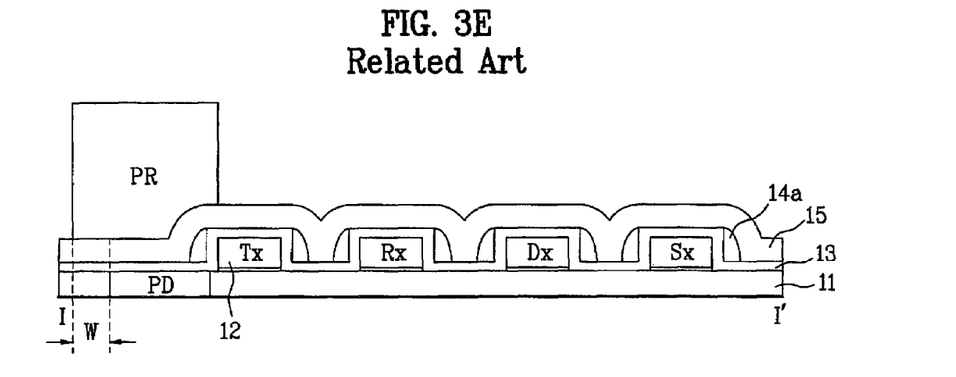

Next, as shown in FIG. 3D, a TEOS layer 15 is formed on the entire surface of the semiconductor substrate 11, wherein the TEOS layer 15 functions as a silicide blocking layer. Then, as shown in FIG. 3E, a photoresist PR is coated on the TEOS layer 15 for the silicide blocking layer, and is then patterned to remain on the photodiode area PD by exposure and development. At this time, the photoresist PR is larger at a range of 'W' than the photodiode area PD, in due consideration of the layout margin of wet-etching process.

Figure 3F:
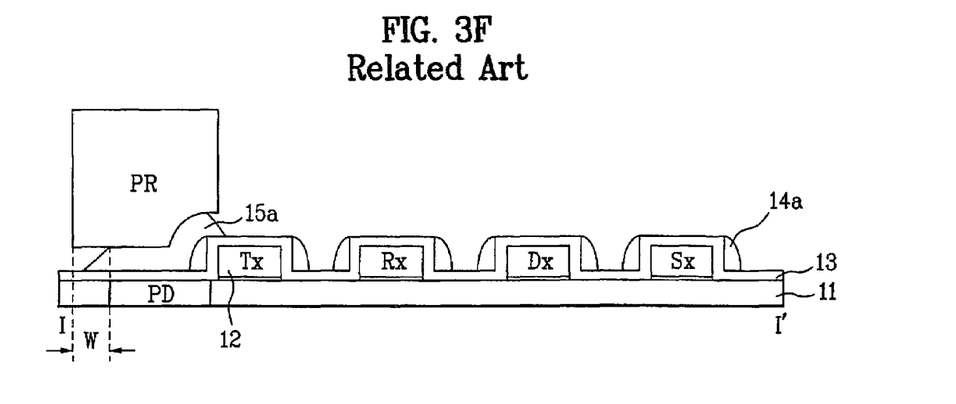
Figure 3G:
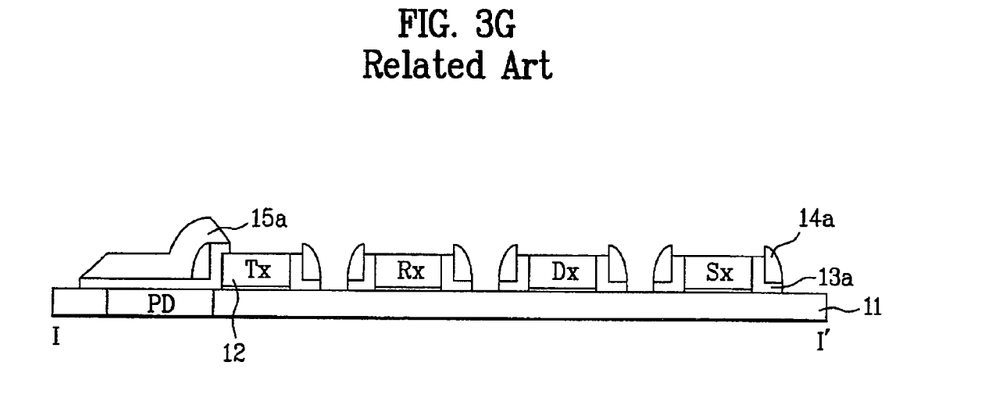
Figure 3H:
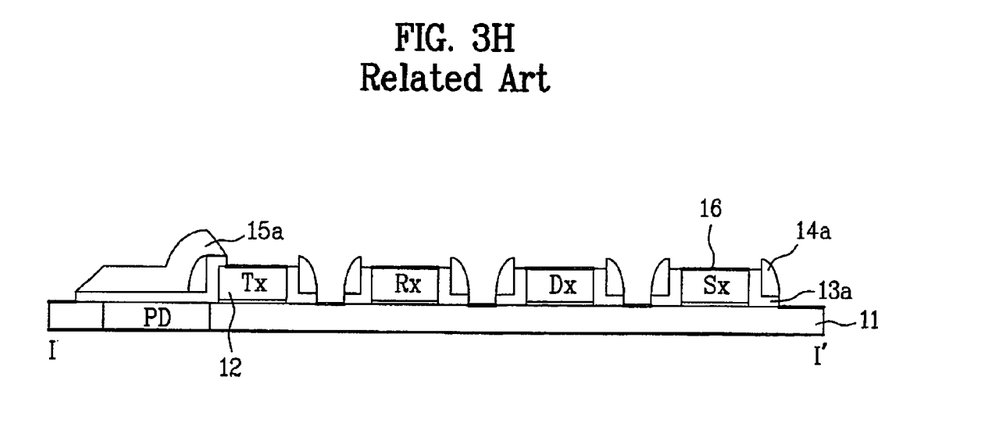

Subsequently, as shown in FIG. 3F, the TEOS layer 15 is wet-etched in state of using the patterned photoresist PR as a mask, thereby forming the silicide blocking layer 15a.

Although not shown, the silicide blocking layer 15a has a tapered edge profile due to the wet-etching process, the isotropic etching process. The silicide blocking layer 15a of the tapered edge profile has the problem in that it can not perform the blocking function in the silicide process.

The silicide blocking layer 15a is formed by the wet-etching process. The wet-etching process is advantageous in that it can decrease the surface damage of silicon. However, in case of the wet-etching process, it is difficult to control the process. Also, with the scale-down on chip, it is impossible to obtain the uniform chip efficiency.

Figure 4:
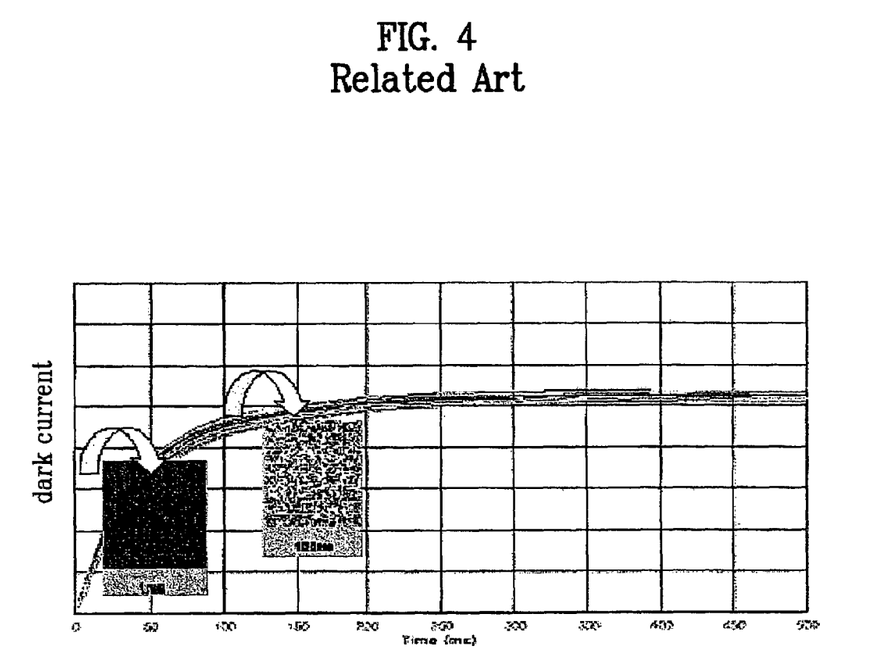
FIG. 4 is a graph of measuring a dark current by an integration time of a CMOS image sensor according to the related art.

FIG. 4 is a graph of measuring a dark current by an integration time of the CMOS image sensor according to the related art, in which a high dark current level is shown.

Figure 5A:
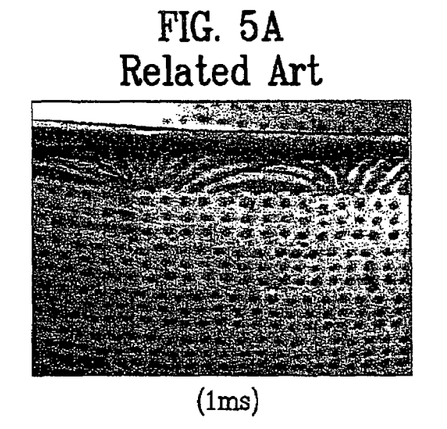
FIG. 5A, FIG. 5B and FIG. 5C are capture images when having an integration time of 1 ms, 20 ms and 100 ms in a CMOS image sensor according to the related art.
Figure 5B:
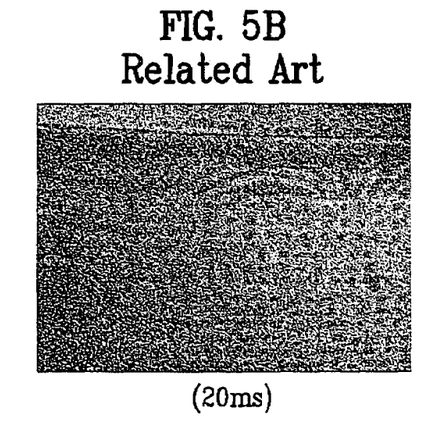
Figure 5C:
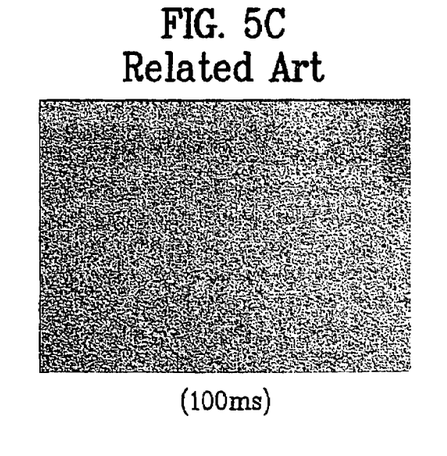

FIG. 5A, FIG. 5B and FIG. 5C are capture images when having an integration time of 1 ms, 20 ms and 100 ms in the CMOS image sensor according to the related art. In this case, a micro white defect is serious, so that it is difficult to recognize the image after the long integration time.

As the integration time increases, more pairs of electron and hole are generated. That is, the image becomes brighter, whereby it is difficult to recognize the image after the integration time.

Figure 6A:
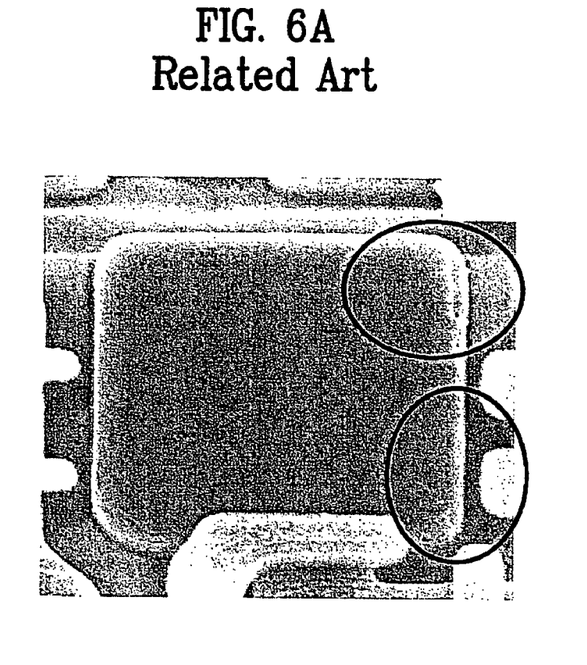
FIG. 6A and FIG. 6B are SEM photographs of a CMOS image sensor according to the related art.
Figure 6B:
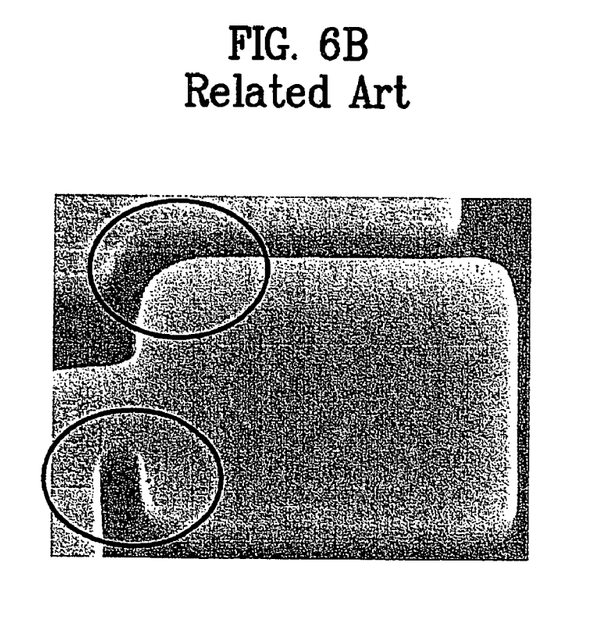

FIG. 6A and FIG. 6B are SEM photographs of the CMOS image sensor according to the related art. As shown in FIG. 6A and FIG. 6B, the photodiode area PD is not covered with the silicide blocking layer 15a since the silicide blocking layer 15a has the tapered edge profile. Accordingly, the defects may be generated in the edge of the photodiode area PD and the edge of the spacer adjacent to the photodiode area PD by stress.

SUMMARY OF THE INVENTION

Accordingly, the present invention is directed to a method for fabricating a CMOS image sensor that substantially obviates one or more problems due to limitations and disadvantages of the related art.

An object of the present invention is to provide a method for fabricating a CMOS image sensor, to decrease a dark current.

Another object of the present invention is to provide a method for fabricating a CMOS image sensor, to prevent the defects from being generated in the edge of a photodiode area and the edge of a gate spacer adjacent to the photodiode area.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method for fabricating a CMOS image sensor includes the steps of forming a photodiode area in a semiconductor substrate; forming a plurality of gates including a first gate on the semiconductor substrate, wherein the first gate has one side aligned to the edge of the photodiode area; sequentially forming a first insulating layer and a second insulating layer on an entire surface of the semiconductor substrate; forming a first photoresist, wherein the first photoresist is patterned so as to expose the upper side of the first gate and the other side of the gate being opposite to one side of the gate; forming a spacer at the other side of the first gate by dry-etching the second insulating layer in state of using the first photoresist as a mask, and forming a silicide blocking layer above the photodiode area; and removing the first photoresist.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings:

FIG. 3A to FIG. 3F are cross sectional views of showing the process for fabricating a CMOS image sensor according to the related art;

FIG. 7A through FIG. 7F are cross sectional views of showing the process for fabricating a CMOS image sensor according to the preferred embodiment of the present invention;

FIG. 8A to FIG. 8D are SEM photographs of a CMOS image sensor according to the preferred embodiment of the present invention;

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, a method for fabricating a CMOS image sensor according to the present invention will be described with reference to the accompanying drawings.

Figure 7A:
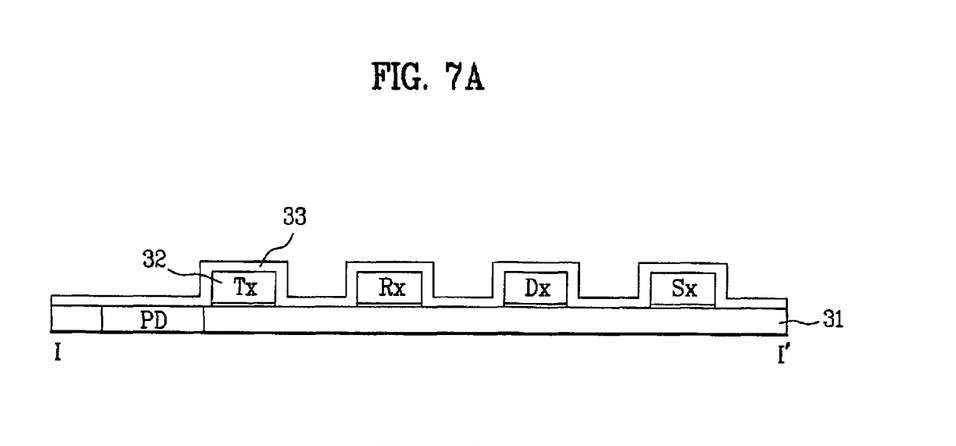
Figure 7B:
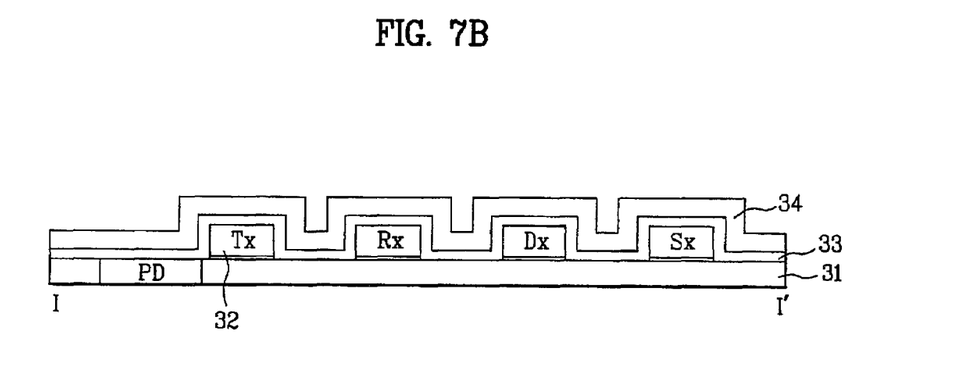
Figure 7C:
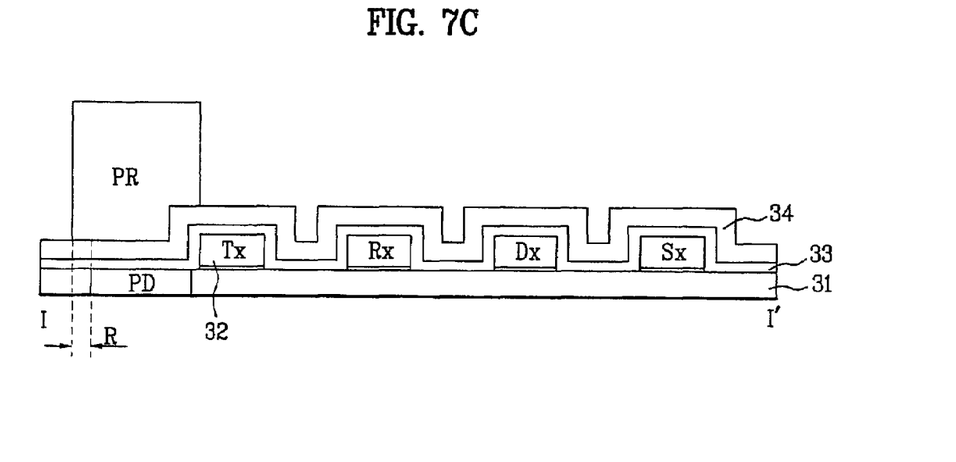
Figure 7D:
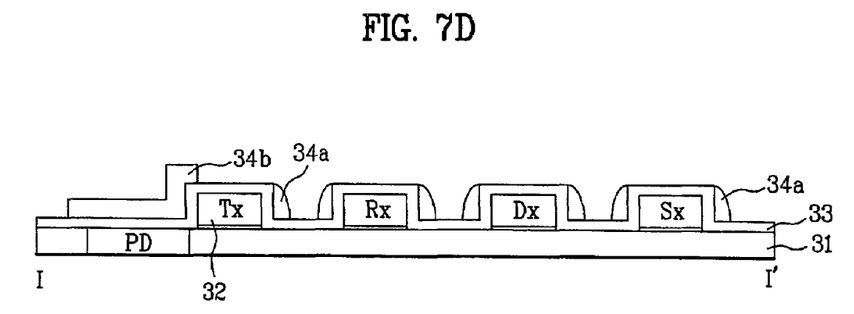

FIG. 7A and FIG. 7D are cross sectional views of showing the process for fabricating a CMOS image sensor according to the preferred embodiment of the present invention, which mainly show a photodiode PD and an adjacent transfer transistor Tx.

As shown in FIG. 7A, a photodiode area PD is formed in a semiconductor substrate 31, and then a plurality of gates are formed on the semiconductor substrate 31 by interposing a gate oxide layer. Among the plurality of gates, one side of the gate 32 of the transfer transistor Tx is aligned to the edge of the photodiode area PD. Then, a TEOS layer 33 is formed on the surface of the semiconductor substrate 31 including the gate 32.

Referring to FIG. 7B, a nitride layer 34 is formed on the TEOS layer 33, and a photoresist PR is coated thereon. As shown in FIG. 7C, the photoresist PR is patterned so as to expose the upper side of the gate 32 and the other side of the gate 32, wherein the other side of the gate 32 is opposite to one side of the gate 32 aligned to the edge of the photodiode area PD.

Accordingly, the area including the remaining gates (not shown) except the photodiode area PD and the gate 32 is masked by the photoresist PR. At this time, the photoresist PR is larger at a range of 'R' than the photodiode area PD, in due consideration of the layout margin of a dry etching process.

As shown in FIG. 7D, the nitride layer 34 is dry-etched in state of using the patterned photoresist PR as a mask. According to the dry etching process, the nitride layer 34 is etched at the constant thickness. Thus, the semiconductor substrate 31 and the nitride layer 34 above the gate 32, which are not masked by the photoresist PR, are completely removed. However, the nitride layer 34 formed at the side of the gate 32 remains, whereby the remaining nitride layer 34 serves as a spacer 34a. Also, the nitride layer 34 masked by the photoresist PR serves as a silicide blocking layer 34b.

As shown in FIG. 7D, the photoresist PR is removed.

Figure 7E:
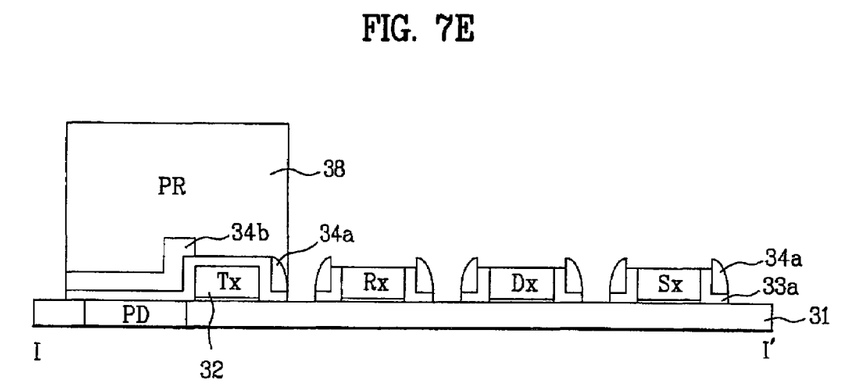

FIG. 7E shows a photoresist PR 38 formed to cover the photodiode area PD, the spacer 34a and the gate 32. By etching-back the nitride layer 34 (see also FIG. 7D), insulating sidewalls are formed at both sides of the remaining gates except the gate 32. If forming the insulating sidewalls with the spacer 34a together, the surface of silicon may be damaged in the following process such as source and drain ion implantation and TEOS layer removing process, due to the remaining oxide layer by the dry etching process. In this respect, the insulating sidewalls for the spacers of the gates are separately formed from the spacer for the one side of the gate 32 of the transfer transistor aligned to the edge of the photodiode area PD.

Figure 7F:
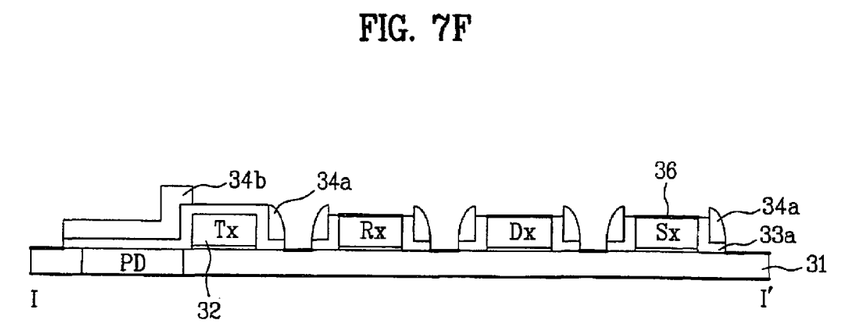

Subsequently, after removing the TEOS layer 33, (as shown in FIG. 7F), a silicide process is performed in state of using the silicide blocking layer 34b as a mask. Accordingly, a silicide is formed not in the photodiode area but in a logic area.

FIG. 8A to FIG. 8D are SEM photographs of the CMOS image sensor according to the preferred embodiment of the present invention.

Figure 8A:
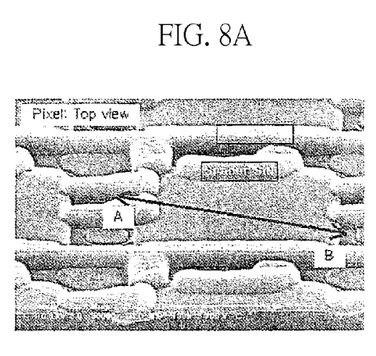
Figure 8B:
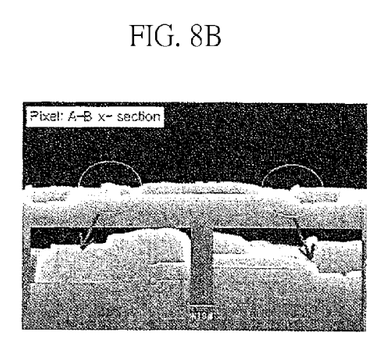
Figure 8C:
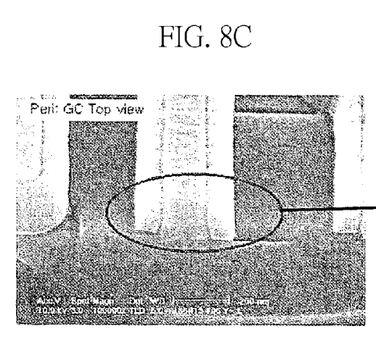
Figure 8D:
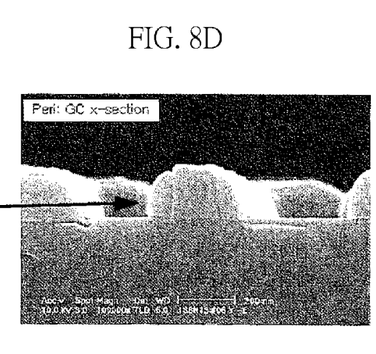

The gate spacer of the transfer transistor adjacent to the photodiode area PD in FIG. 8A and FIG. 8B is different in shape from the spacers of the other gates in FIG. 8C and FIG. 8D. The gate spacer of the transfer transistor adjacent to the photodiode area PD is formed in the dry etching process of using the mask. In the meantime, the spacers of the other gates are formed in the etch-back process.

Figure 9:
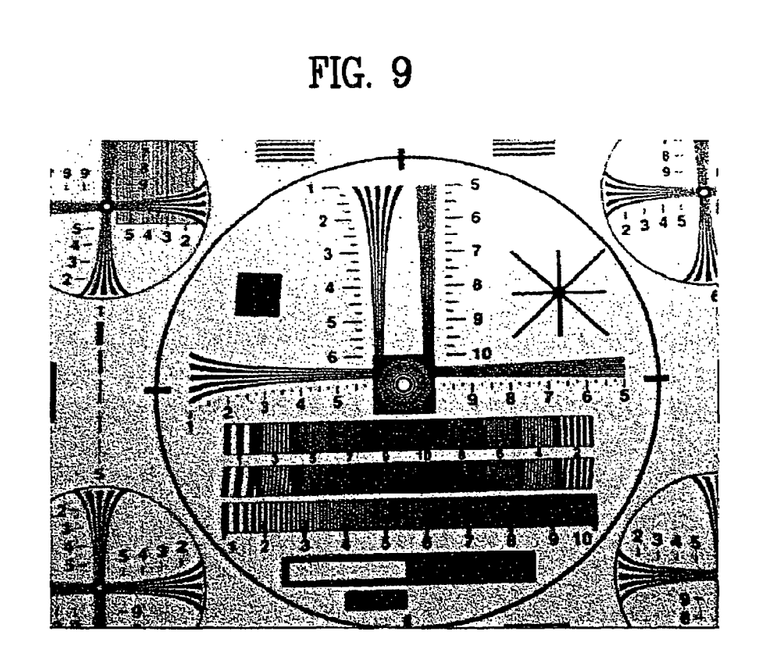
FIG. 9 is a monochrome test charge image of a CMOS image sensor according to the preferred embodiment of the present invention.
Figure 10:
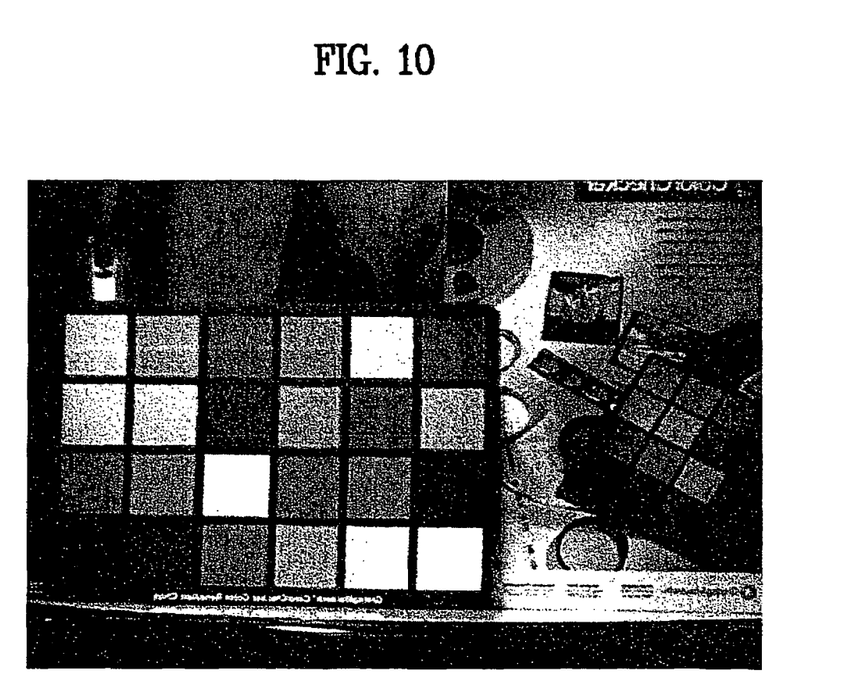
FIG. 10 is a color chart image of a CMOS image sensor according to the preferred embodiment of the present invention.

FIG. 9 is a monochrome test charge image of the CMOS image sensor according to the preferred embodiment of the present invention. FIG. 10 is a color chart image of the CMOS image sensor according to the preferred embodiment of the present invention. The CMOS image sensor fabricated by the present invention has the improved dark characteristics and obtains the clear image.

As mentioned above, the method for fabricating the CMOS image sensor according to the present invention has the following advantages.

The space of the gate adjacent to the photodiode area is formed in the dry etching process of using the mask, whereby the silicide blocking layer is formed at the constant thickness. Accordingly, the photodiode area is protected from the silicide process. Also, it is possible to prevent the dark current from being generated.

The spacers of the other gates except the gate adjacent to the photodiode area are formed in the etch-back process, whereby they have no remaining oxide layer. Accordingly, it is possible to prevent the surface of silicon from being damaged in the following process such as source and drain ion implantation and TEOS layer removing process.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for fabricating a CMOS image sensor comprising:
   forming a photodiotic area in a semiconductor substrate;
   forming a plurality of gates including a first gate on the semiconductor substrate, wherein the first gate has one side aligned to an edge of the photodiode area;
   sequentially forming a first insulating layer and a second insulating layer on an entire surface of the semiconductor substrate;
   forming a first patterned photoresist so as to expose an upper side of the first gate and an other side of the first gate opposite to the one side of the first gate;
   forming a spacer at the other side of the first gate by dry-etching the second insulating layer using the first patterned photoresist as a mask, and forming a silicide blocking layer above the photodiode area;
   removing the first patterned photoresist;
   forming a second photoresist covering the photodiode area, the upper side of the first gate and the spacer, after removing the first photoresist;
   forming spacers at sides of the plurality of gates other than the first gate by etching-back the first insulating layer using the second photoresist as a mask; and
   removing the second photoresist.

2. The method of claim 1, wherein the first insulating layer comprises a TEOS layer.

3. The method of claim 1, wherein the second insulating layer comprises a nitride layer.

4. The method of claim 2, wherein the second insulating layer comprises a nitride layer.

5. The method of claim 1, wherein forming the spacer at the other side of the first gate comprises dry-etching the second insulating layer and without removing the first insulating layer.

6. The method of claim 5, wherein forming the spacer at the other side of the first gate also forms the suicide blocking layer above the photodiode area.

7. The method of claim 5, wherein the second insulating layer comprises a nitride layer.

8. The method of claim 5, wherein the first insulating layer comprises a TEOS layer.

9. The method of claim 8, wherein the second insulating layer comprises a nitride layer.

10. The method of claim 1, wherein the first gate comprises a transfer gate adjacent to the photodiode area.

11. The method of claim 10, wherein the other gates of the plurality of gates comprise a reset gate, a drive gate and a select gate.

12. The method of claim 1, wherein etching back the second insulating layer exposes the other gates of the plurality of gates.

13. The method of claim 12, further comprising performing a silicide process using the silicide blocking layer as a mask.

* * * * *